United States Patent [19] [11] 4,447,272
Saks [45] May 8, 1984

[54] METHOD FOR FABRICATING MNOS STRUCTURES UTILIZING HYDROGEN ION IMPLANTATION

[75] Inventor: Nelson S. Saks, Alexandria, Va.

[73] Assignee: The United States of America as represented by the Secretary of the Navy, Washington, D.C.

[21] Appl. No.: 443,828

[22] Filed: Nov. 22, 1982

[51] Int. Cl.³ .................. H01L 7/54; H01L 21/263
[52] U.S. Cl. ........................ 148/1.5; 29/571; 29/576 B; 29/576 T; 148/187; 357/91
[58] Field of Search .............. 148/1.5, 187; 29/571, 29/576 B, 576 T; 357/91

[56] References Cited

U.S. PATENT DOCUMENTS

| | | | |
|---|---|---|---|
| 3,849,204 | 11/1974 | Fowler | 148/1.5 |
| 3,852,120 | 12/1974 | Johnson et al. | 148/1.5 |
| 3,923,559 | 12/1975 | Sinha | 148/1.5 |
| 4,151,007 | 4/1979 | Levinstein et al. | 148/1.5 |
| 4,184,896 | 1/1980 | Millea | 148/1.5 |
| 4,197,144 | 4/1980 | Kirkpatrick et al. | 148/1.5 |
| 4,328,610 | 5/1982 | Thompson et al. | 29/571 |
| 4,332,627 | 6/1982 | Schmitt et al. | 148/1.5 |
| 4,364,779 | 12/1982 | Kamgar et al. | 148/1.5 |

OTHER PUBLICATIONS

"Radiation Hard Charge-Coupled Device Operating at 77° K. Using Nitride/Oxide Gate Insulators", *IEEE Proceedings of International Electron Device Meeting*, pp. 629-632; Dec. 1979, (N. Bluzer et al.).
"Hydrogen Annealed Nitride/Oxide Dielectric Structures for Radiation Hardness", M. C. Peckerar et al., *IEEE Transactions on Nuclear Science*, vol. NS-27, No. 6, Dec. 1980.
Johnson et al., J. Vac. Sci. Technol., 19(3), [1981], 390.
Feldman et al., Phys. Rev. Letts. 41, (1978), 1396.
Topich et al., Appl. Phys. Letts. 41, (1982), 641.
Balk et al., IBM-TDB, 10 (1968), 1277.

*Primary Examiner*—Upendra Roy
*Attorney, Agent, or Firm*—Robert F. Beers; William T. Ellis; Charles E. Krueger

[57] ABSTRACT

An improved method for reducing the density of electronic trapping states and fixed insulator charge in the thin oxide layer of an MNOS structure. The method includes the steps of implanting hydrogen ions in field region of the oxide layer and annealing the MNOS structure at 400° C. to cause the ions to diffuse laterally into the gate region of the oxide layer.

9 Claims, 2 Drawing Figures

METHOD FOR FABRICATING MNOS STRUCTURES UTILIZING HYDROGEN ION IMPLANTATION

BACKGROUND OF THE INVENTION

The invention relates generally to methods of improving the performance of MNOS structures and more particularly pertains to a method for reducing the density of electronic trapping states and fixed insulator charge in an MNOS structure with a thin oxide layer.

There is a growing class of applications for solidstate electronic devices, such as Charge-Coupled-Devices (CCD) and Field-Effect Transistors (FET), that require operability at cryogenic temperatures and tolerance to ionizing radiation. Such applications include the use of CCDs in conjunction with large area infrared photodetector arrays for imaging and signal processing. Another application is the use of solid state electronic devices in outer space.

In order to achieve radiation hardening and operability at cryogenic temperatues an MNOS (metal-silicon nitride-silicon dioxide-semiconductor) dual dielectric insulator structure is often used in place of pure silicon dioxide as the gate insulator in electronic MOS (metal-oxide-semiconductor) devices such as FETs and CCDs (the "gate" insulator refers to the insulator in the active regions of the devices such as the FET gate).

A nitride/oxide insulator structure utilized as an active gate insulator in an MOS device is described in the paper by M. C. Peckerar et al. entitled "Hydrogen Annealed Nitride/Oxide Dielectric Structures for Radiation Hardness", IEEE Transactions on Nuclear Science, Vol. NS-27, No. 6, Dec. 1980. In that article superior radiation tolerance of nitride compared with oxide is discussed along with the need for a thin oxide layer between the nitride and silicon regions to prevent memory effects. The authors found that high temperature post-dielectric processing degraded the performance of the gate due to the introduction of electron trapping states and fixed insulator charge in the oxide layer. However, they discovered that a high temperature hydrogen anneal reduced the interface density states to a value of about $1 \times 10^{10}$ states/cm$^2$eV. This high temperature hydrogen anneal includes the steps of exposing the surface of the MNOS structure to hydrogen gas (H$_2$) and heating the structure to a predetermined temperature.

It is well established that the diffusion rate of hydrogen is substantially higher in silicon dioxide compared to silicon nitride at typical annealing temperatures. Therefore, in MNOS structures, it has been shown that the hydrogen enters the oxide layer through vent holes in the nitride layer during the high temperature anneal. These vent holes, or other openings, must be formed in the nitride layer prior to the high temperature hydrogen anneal. The hydrogen then diffuses laterally into the gate region, and chemically reacts at the oxide-silicon interface. Thus, a very high annealing temperature (typically 650°–1000° C.) is required to obtain lateral diffusion of hydrogen through the oxide layer in MNOS structures when the layer is very thin ($\leq$100 Å) as is required for radiation-tolerant devices.

This high annealing temperature, required by existing techniques, has several disadvantages. First, the heating of the structure increases the fixed insulator charge thereby degrading device performance. Second, the aluminum gate contact must be deposited after the hydrogen anneal since the aluminum can only tolerate temperatures up to 500° C. However, aluminum deposition increases surface charge density. Finally, the density of electronic states has not been reduced below the level originally present before high temperature post dielectric processing.

OBJECTS OF THE INVENTION

Accordingly, it is an object of the invention to decrease the temperature, required by current techniques, of the hydrogen anneal.

It is a further object of the invention to remove the requirement to open vent holes in the nitride layer as is required by conventional high-temperature hydrogen annealing.

It is still a further object of the invention to decrease the density of electronic states and surface charge below a level achievable by current techniques.

It is still a further object of the invention to permit the formation of the aluminum interconnect and/or gate metallization prior to the hydrogen anneal.

SUMMARY OF THE INVENTION

The above and other objects are achieved in the present invention which comprises a novel method for reducing the density of electronic states and the fixed insulator charge in the thin oxide layer of an MNOS structure of the type having a gate and field and gate regions. The method includes the steps of implanting hydrogen ions into the oxide layer of the MNOS structure such that the gate blocks the hydrogen implant from the gate region of the oxide layer, and then annealing to cause the hydrogen ions to diffuse laterally into the gate region.

The method of the invention reduces the required temperature of the hydrogen anneal to below 500° C. and provides for a lower density of electronic trapping states and fixed insulator charge than previously achieved in thin oxide layers of MNOS structures.

DETAILED DESCRIPTION OF A PREFERRED EMBODIMENT

Briefly, the method of the invention utilizes ion implantation to position hydrogen ions in the thin oxide layer of an MNOS structure without requiring vent holes. A subsequent annealing step causes the hydrogen to diffuse laterally into the gate region of the oxide layer and react chemically at the Si—SiO$_2$ interface to reduce the interface state density and density of fixed oxide charge. The annealing temperature required is lower than in existing methods most likely because ion implantation produces a high density of chemically reactive H$^+$ in the oxide layer, whereas less reactive H$_2$ is the dominant species in the conventional hydrogen gas anneal.

Figure 1:
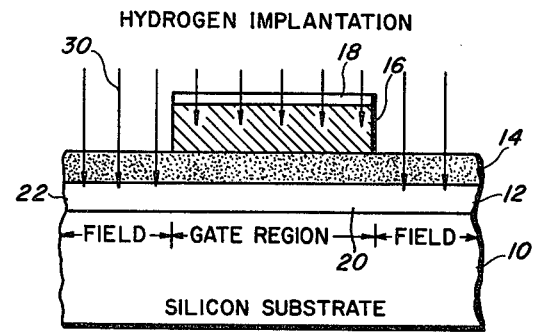
FIG. 1 shows an MNOS structure for processing by the method of the present invention.

Referring now to the drawings, wherein like reference numerals designate identical or corresponding parts throughout the several views, and more particularly to FIG. 1 thereof, an MNOS structure for processing by the method of the present invention is depicted. The process steps for making the structure of FIG. 1 are conventional. A silicon substrate 10, of either the P or N type, has a silicon dioxide (oxide) layer 12 formed thereon in a known manner by thermal oxidation. The oxide layer 12 is a thin layer about 90 Angstroms thick. Next a silicon nitride (nitride) layer 14 is deposited on the oxide layer in a known manner by chemical vapor deposition. A gate electrode 16 of polysilicon and a gate contact 18 are subsequently deposited by known techniques. Note that the section of the oxide layer 12 disposed below the gate electrode 16 is designated the gate region 20 while the section of the oxide layer 12 not disposed below the gate electrode 16 is designated the field region 22.

The structure depicted in FIG. 1 is exposed to a beam of hydrogen ions 30 so that the ions are implanted in the structure. The energy and dose of the beam is selected, utilizing techniques well known in the art, so that the peak of the implanted hydrogen profile is in the thin oxide layer 12 with a fluence in the range of $10^{15}-10^{16}$ $H+/cm^2$.

The gate electrode 16 should be thick enough to block the hydrogen implant from the gate region 20 of the thin oxide layer 12 thereby precluding the effects of implantation damage in the active region of the device. Thus, hydrogen ions are implanted solely in the field region of the oxide layer 12, whereas no hydrogen ions are implanted in the gate region 20.

Subsequent to this ion implantation step the MNOS structure is annealed at approximately 400° for 1-2 hours. This annealing step causes the ions implanted in the field region 22 to diffuse laterally into the gate region 20 and to chemically react at the substrate 10-oxide layer 12 interface. This chemical reaction reduces the density of interface electronic trapping states.

The efficiency of the lateral diffusion of hydrogen into the gate region 20 during the anneal is increased by the nitride layer 14 disposed over the oxide layer 12. This increase of efficiency is due to the low diffusion rate of hydrogen in the nitride layer 14 which prevents the hydrogen from diffusing vertically out of the oxide layer 12 during the anneal. However, small openings, necessary for device fabrication or other purposes, may be formed in the nitride layer 14 without seriously affecting the lateral diffusion of the hydrogen into the gate region 20 of the oxide layer 12.

The MNOS structure processed by the present method has been shown experimentally to have very low electronic trapping state densities. Ultra-low densities as low as $7 \times 10^7$ states/$cm^2-$eV at midgap have been measured. This density is at least an order of magnitude lower then the lowest values currently achievable in either MNOS or MOS structures by any existing annealing method.

The net fixed insulator charge is also reduced for MNOS structures processed by the current method. Total fixed charge of less than $\pm 5 \times 10^{10}$e/$cm^2$ has been measured.

Additionally, since the annealing temperature is below 500° C., the aluminum electrodes may be deposited prior to the annealing step. This is an advantage due to the fact that the deposition of the aluminum electrodes after the anneal increases fixed insulator charge density.

Figure 2:
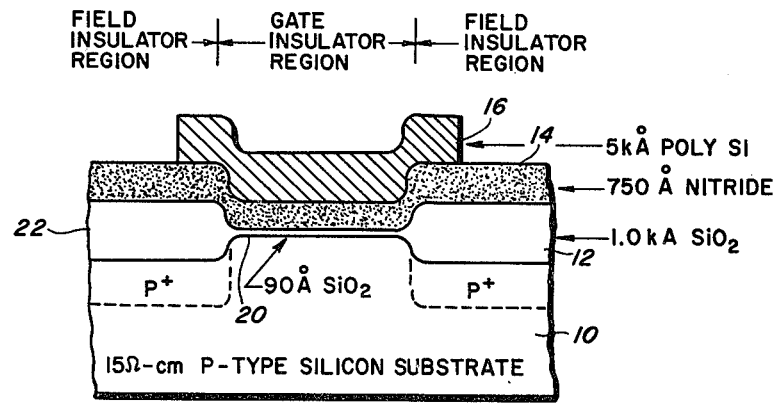
FIG. 2 depicts a cross-sectional view of an MNOS structure processed by the present method.

FIG. 2 depicts a cross sectional view of an MNOS structure of a CCD processed by the present method. The characteristics and methods of fabrication of the CCD are reported in the article by N. S. Saks entitled "Fabrication of Surface-Channel Charge-Coupled Device with Ultralow Density of Interface States", Appl. Phys. Lett. 41(8), Oct. 15, 1982.

Referring now to FIG. 2, an oxide layer 12, 90 Angstroms thick in the gate region 20 and 1000 Angstroms thick in the field region 22 is formed on the surface of a P-type silicon substrate 10. A nitride layer 14, 750 Angstroms thick is then formed on the oxide layer 12. The polysilicon gate 16 is 5,000 Angstroms thick.

The CCD is then implanted with $5 \times 10^{15}$H+ ions/$cm^2$ at 20 keV (equivalent to $1.5 \times 10^{16}$H+ ions/$cm^2$ at 6.7 keV) to reduce the interface state density. At this energy, the range of the implanted hydrogen is not long enough to penetrate the 5,000 Angstrom polysilicon gate layer 16, which prevents direct implant damage from occurring in the sensitive MNOS gate insulator. The implant energy is chosen such that most of the hydrogen will penetrate the silicon nitride layer 14 in the field insulator region not covered by the gate 16 and stop in the 1000 Angstrom field oxide layer 12. During the 400° C. anneal following implantation, the implanted hydrogen diffuses laterally into the thin gate oxide layer 12 where it reduces the interface state density. Following implantation and anneal the interface state density measured by an ac conductance technique on on-chip test capacitors is in the range $1-3 \times 10^8/cm^2-$eV.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed and desired to be secured by Letters Patent of the United States is:

1. An improved method for reducing the density of electronic trapping states and fixed insulator charge in the oxide layer of an MNOS structure of the type having a gate, said oxide layer including a gate region disposed below the gate, and a field region surrounding said gate region, said method comprising the steps of:
   implanting hydrogen ions in the MNOS structure such that the gate blocks the hydrogen implant from the gate region of the oxide layer, the field region of the oxide layer of the MNOS structure thereby being implanted with hydrogen ions; and
   annealing the MNOS structure to cause said implanted hydrogen ions in the field region of the oxide layer to diffuse laterally into the gate region of the oxide layer and to chemically react at the Si—SiO$_2$ interface to reduce the density of electronic trapping states and fixed oxide charge.

2. The method recited in claim 1 wherein:
   the step is implanting hydrogen ions is terminated when the fluence of hydrogen ions in the oxide layer is in the range of from about $10^{15}$ ions/$cm^2$ to about $10^{16}$ ions/$cm^2$.

3. The method recited in claim 2 wherein:
   said step of implanting hydrogen ions includes adjusting the energy of said hydrogen ions so that the peak of the implanted hydrogen profile is in oxide layer.

4. The method recited in claim 1 wherein:
   said step of annealing includes heating the MNOS structure to a temperature of about 400° C.

5. The method recited in claim 3 wherein:
   said step of annealing includes heating the MNOS structure to a temperature of about 400° C.

6. An improved method for reducing the density of electronic trapping states and fixed insulator charge in the oxide layer of an MNOS structure of the type with a continuous nitride layer disposed over the oxide layer, said nitride layer having a gate formed on its upper surface, and wherein said oxide layer includes a gate region disposed below the gate, and a field region surrounding said gate region, said method including the steps of:

implanting the oxide layer with hydrogen ions such that the gate blocks the hydrogen implant from the gate region of the oxide layer;

adjusting the energy of said ions to cause the peak of the implanted hydrogen ions to be positioned in the oxide layer;

terminating said step of implanting when the fluence of hydrogen ions in the oxide layer is from about $10^{15}$ ions/cm$^2$ to $10^{16}$ ions/cm$^2$;

heating the MNOS structure to about 400° C. for about 1 to about 2 hours.

7. The method recited in claim 6 wherein:
the gate region of the oxide layer of the MNOS structure is about 90 Angstroms thick;
the nitride layer of the MNOS structure is about 750 Angstroms thick; and
the gate of the MNOS structure is formed from polysilicon and is about 5,000 Angstroms thick.

8. The method recited in claim 7 wherein:
said implanting step utilizes hydrogen atoms with energies insufficient to penetrate the gate.

9. An improved method for reducing the density of electronic trapping states and fixed insulator charge in the oxide layer of an MNOS structure of the type having a gate, said oxide layer including a gate region disposed below the gate, and a field region surrounding said gate region, said method comprising the steps of:

implanting hydrogen ions solely in the field region of the oxide layer of the MNOS structure, such that no hydrogen ions are implanted in the gate region; and annealing the MNOS structure to cause said implanted hydrogen ions in the field region of the oxide layer to diffuse laterally into the gate region of the oxide layer and to chemically react at the Si—SiO$_2$ interface to reduce the density of electronic trapping states and fixed oxide charge.

* * * * *